(12) United States Patent
Thyagarajan et al.

(10) Patent No.: US 9,111,596 B2
(45) Date of Patent: Aug. 18, 2015

(54) MEMORY ACCESS CONTROL IN A MEMORY DEVICE

(71) Applicant: ARM Limited, Cambridge (GB)

(72) Inventors: Sriram Thyagarajan, Austin, TX (US); Yew Keong Chong, New Braunfels, TX (US); Wang-Kun Chen, New Braunfels, TX (US); Gus Yeung, New Braunfels, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 13/967,908

(22) Filed: Aug. 15, 2013

(65) Prior Publication Data

US 2015/0049568 A1 Feb. 19, 2015

(51) Int. Cl.
*G11C 7/10* (2006.01)
*G11C 8/08* (2006.01)
*G11C 8/06* (2006.01)

(52) U.S. Cl.
CPC .. *G11C 8/08* (2013.01); *G11C 8/06* (2013.01); *G11C 7/10* (2013.01)

(58) Field of Classification Search
CPC ...... G11C 7/1051; G11C 7/22; G11C 7/1072; G11C 7/1006; G11C 7/1066
USPC .............. 365/189.15, 185.13, 230.03, 230.05
See application file for complete search history.

(56) References Cited

U.S. PATENT DOCUMENTS

| 5,406,526 | A | 4/1995 | Sugibayashi et al. |
| 6,775,200 | B1 | 8/2004 | Khan et al. |
| 2002/0048210 | A1 | 4/2002 | Tomotani |
| 2005/0052934 | A1* | 3/2005 | Tran et al. ................ 365/230.03 |
| 2005/0146972 | A1 | 7/2005 | Hong |
| 2007/0153584 | A1 | 7/2007 | Mohammad et al. |
| 2011/0090728 | A1 | 4/2011 | Yu et al. |

FOREIGN PATENT DOCUMENTS

| KR | 2002-0096411 | 12/2002 |
| WO | 2011/106262 | 9/2011 |

OTHER PUBLICATIONS

UK Search Report dated Dec. 19, 2014 in GB 1412107.3, 6 pages.
Goswami, N. et al., "Power-performance Co-optimizaiton of Throughput Core Architecture using Resistive Memory", IEEE, (2013), 12 pages.

* cited by examiner

*Primary Examiner* — Jason Lappas
(74) *Attorney, Agent, or Firm* — Pramudji Law Group PLLC; Ari Pramudji

(57) ABSTRACT

A memory device comprises an array of bitcells arranged as a plurality of rows of bitcells and a plurality of columns of bitcells, and has a plurality of wordlines and a plurality of readout channels. A control unit is configured to control access to the array of bitcells, wherein in response to a memory access request specifying a memory address the control unit is configured to activate a selected wordline and to activate the plurality of readout channels, and to access a row of bitcells in said array storing a data word and addressed by the memory address. The data word consists of a number of data bits given by a number of bitcells in each row of bitcells. The control unit is further configured to be responsive to a masking signal and, when the masking signal is asserted when said memory access request is received, the control unit is configured to activate only a portion of the selected wordline and a portion of the plurality of readout channels, such that only a portion of the data word is accessed.

13 Claims, 6 Drawing Sheets

MEMORY ACCESS CONTROL IN A MEMORY DEVICE

BACKGROUND OF THE INVENTION

1. Field of the Invention

The present invention relates to memory devices. More particularly, this invention relates to controlling the access to such memory devices.

2. Description of the Prior Art

FIG. 1 schematically illustrates a known data processing apparatus which is embodied as a system-on-chip (SoC) device 10. Within this SoC device 10 are provided a processor unit (CPU) 11 and two memory banks 12 and 13. The CPU 11 uses the memory banks 12 and 13 to store data which it makes use of in its data processing operations. The CPU 11 accesses the memory banks 12 and 13 via a system bus 14 which couples these components together. The CPU 11 is configured to issue a memory access request onto the system bus 14 when it requires access (whether read or write) to data stored in one of the memory banks. As schematically illustrated in FIG. 1, the CPU 11 therefore passes an address onto the system bus and sends or receives (depending on whether the memory access request is a read or a write operation) data to/from the system bus. Each memory bank 12, 13 is respectively provided with a control unit 15, 16 which administers overall control of the respective memory bank, in particular interpreting the address received from the CPU 11 via the system bus 14 to cause the correct storage locations within the memory bank (typically configured as an array of bit cells) to be accessed.

The CPU 11 is additionally configured to generate a chip select signal which is also passed via the system bus 14 to the memory banks 12, 13. This chip select signal acts as an overall enable signal with respect to the memory banks, and causes the entire memory bank to be powered up or powered down. The chip select signal may serve to indicate which of the memory banks 12, 13 the address passed from the CPU 11 should be applied to, for example in the situation where each memory bank covers the same address space and therefore the chip select signal is required to distinguish between the two. Even if there is no overlap in the memory spaces used by the two memory banks, it is generally desirable in a SoC device to reduce its power consumption as far as possible and accordingly the CPU 11 can make use of the chip select signal to power down a memory bank which is not currently in use. The control units 15, 16 of the memory banks 12, 13 are therefore configured to respond to the assertion of a chip select signal identifying that particular memory bank by causing it to power up or power down as appropriate. Whilst this technique is advantageous in terms of the power saving advantages it brings, the process of powering up/powering down a memory bank comes at the cost of some delay whilst this is carried out.

It would be desirable to provide an improved technique for reducing the power consumption of such memory devices.

SUMMARY OF THE INVENTION

Viewed from a first aspect, the present techniques provide a memory device comprising:

an array of bitcells, each bitcell configured to store a data bit, wherein said array comprises a plurality of rows of bitcells and a plurality of columns of bitcells;

a plurality of wordlines, wherein each row of bitcells has an associated wordline;

a plurality of readout channels, wherein each column of bitcells has an associated readout channel; and a control unit configured to control access to said array of bitcells, wherein in response to a memory access request which specifies a memory address said control unit is configured to activate a selected wordline and to activate said plurality of readout channels, and to access a row of bitcells in said array storing a data word and addressed by said memory address, wherein said data word consists of a number of data bits given by a number of bitcells in each row of bitcells, wherein said control unit is further configured to be responsive to a masking signal and, when said masking signal is asserted when said memory access request is received, said control unit is configured to activate only a portion of said selected wordline and a portion of said plurality of readout channels, such that only a portion of said data word is accessed.

The present techniques recognise that a power saving advantage may be derived in a memory device which stores data words which are accessed in response to memory access request in the situation where only a portion of a given data word needs to be accessed. The inventors of the present technique have for example recognised that it is surprising frequent that a memory access request to a memory device only requires access to a portion of the address data word. For example, in a memory device configured to store 64-bit data words, it may be the case that only, say, the lower 32 bits of a 64-bit data word require accessing (whether reading or writing).

To take advantage of this kind of situation, the control unit of the memory device according to the present techniques is configured to be responsive to a masking signal. When this masking signal is asserted in association with a memory access request, the control unit is configured only to partially activate the components of the memory device usually associated with the memory access request. In particular, rather than activating an entire wordline corresponding to the memory address specified in the memory access request, the control unit is configured to activate only a portion of that wordline. Similarly, rather than activate the full set of read out channels of the memory device corresponding to the full data word, the control unit is configured to only activate a portion of the read out channels when the masking signal is asserted. This results in a significant saving of dynamic clock power in the memory device when only a portion of the selected data word needs to be accessed in a memory access request. For example, it has been estimated that in a memory device comprising a bank of which only one half need be accessed a saving of approximately 40% of dynamic power can be achieved. Furthermore, by making this modification to the operation of the memory device at the level of wordline portion selection and read out channel portion selection, much faster activation/deactivation of (at least part of) the memory device can be achieved by comparison to the prior art use of chip select signals to power up and power down an entire memory bank.

Activation of a portion of a selected wordline could be provided in a number of ways, but in one embodiment each wordline of said plurality of wordlines comprises two partial wordlines, each partial wordline associated with part of each row of bitcells, and wherein said portion of said selected wordline is a selected partial wordline. Thus two partial wordline provide the functionality of one "full" wordline and the partial activation of a selected "full" wordline is provided by the activation of only one of those two partial wordlines. Equally, if both partial wordlines are activated then the effect is the same as if a single wordline covering a full bitcell row had been activated.

The activation of a selected wordline, or indeed of a portion of a selected wordline, could be provided in a number of ways, but in one embodiment activation of each partial wordline is dependent on a wordline clock signal and said control unit is configured to generate first and second wordline clock signals, wherein at least one of said first and second wordline clock signals is inactive when said masking signal is asserted. The division of a wordline clock signal into two distinct wordline clock signals thus provides a readily and selectively controllable arrangement by which activation of at least one partial wordline can be suppressed.

It should be appreciated that the portion of the data word which is accessed could in principle be any (non-trivial) subset of the full data word, but in one embodiment said portion of said selected wordline and said portion of said plurality of readout channels correspond to a selected half of said data word.

The selected half of the data word may in some embodiments comprise the most significant bit half of the data word whilst in other embodiments it may comprise the least-significant-bit half of the data word. For example in a 64-bit data word architecture, the present techniques can allow the memory access request to only be carried out with respect to the upper 32-bit half-word or to the lower 32-bit half-word, whilst saving much of the power consumption that would otherwise occur with respect to the unnecessary access to the other half-word.

The masking signal may take a number of forms, but in one embodiment said masking signal is a 2-bit signal, wherein a first bit of said 2-bit signal corresponds to said selected portion of said data word and a second bit of said 2-bit signal corresponds to a remaining portion of said data word. The provision of a bit of the masking signal corresponding to each portion of the data word (for example corresponding to each half-word within that data word) provides an advantageous degree of control over the modification to the memory access request since the activation of the memory device components corresponding to each portion of the data word can be individually controlled. Thus by selected assertion of this two-bit signal, a full (normal) memory access request can be carried out (neither bit asserted), a partial memory access request can be carried out (one bit asserted), or a dummy memory access request may be carried out (both bits asserted).

The portions of the data word accessed in response to a two-bit masking signal may, in some embodiments be selected halves of the data word.

In some embodiments the memory device is a system-on-chip device.

In some embodiments the memory device is further configured to receive a device enable signal, wherein said memory device is configured to transition into an active state in response to assertion of said device enable signal and said memory device is configured to transition into an inactive state in response to de-assertion of said device enable signal. Accordingly, the control unit of the memory device may additionally be responsive to a chip-select style signal which is configured to cause the entire memory device to power up or power down.

Viewed from a second aspect the present techniques provide a computer program storage media storing a memory complier computer program for controlling a computer to generate an instance of a memory device from a memory architecture associated with the memory compiler computer program, the memory architecture specifying a definition of circuit elements and data defining rules for combining those circuit elements, such that said instance generated specifies a memory device accordingly to the first aspect. The computer program storage medium will typically store the memory complier computer program in a non-transient form, as is the case when the computer program is for example stored on a removable storage medium such as a disk or a solid state memory.

Viewed from a third aspect the present techniques provide a memory device comprising an array of means for storing data bits, wherein said array comprises a plurality of rows of means for storing data bits and a plurality of columns of means for storing data bits;

a plurality of wordlines, wherein each row of means for storing data bits has an associated wordline;

a plurality of readout channels, wherein each column of means for storing data bits has an associated readout channel; and means for controlling access to said array of means for storing data bits, wherein in response to a memory access request which specifies a memory address said means for controlling access is configured to activate a selected wordline and to activate said plurality of readout channels, and to access a row of means for storing data bits in said array storing a data word and addressed by said memory address, wherein said data word consists of a number of data bits given by a number of means for storing data bits in each row of means for storing data bits, wherein said means for controlling access is further configured to be responsive to a masking signal and, when said masking signal is asserted when said memory access request is received, said means for controlling access is configured to activate only a portion of said selected wordline and a portion of said plurality of readout channels, such that only a portion of said data word is accessed.

Viewed from a fourth aspect the present techniques provide a method of storing data in a memory device wherein said memory device comprises:

an array of bitcells, each bitcell configured to store a data bit, wherein said array comprises a plurality of rows of bitcells and a plurality of columns of bitcells;

a plurality of wordlines, wherein each row of bitcells has an associated wordline; and a plurality of readout channels, wherein each column of bitcells has an associated readout channel, the method comprising the steps of:

receiving a memory access request which specifies a memory address;

activating a selected wordline of said plurality of wordlines corresponding to said memory address;

activating said plurality of readout channels; and accessing a row of bitcells in said array storing a data word and addressed by said memory address, wherein said data word consists of a number of data bits given by a number of bitcells in each row of bitcells, wherein when a masking signal is received when said memory access request is received, only a portion of said selected wordline and a portion of said plurality of readout channels are activated, such that only a portion of said data word is accessed.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 1:
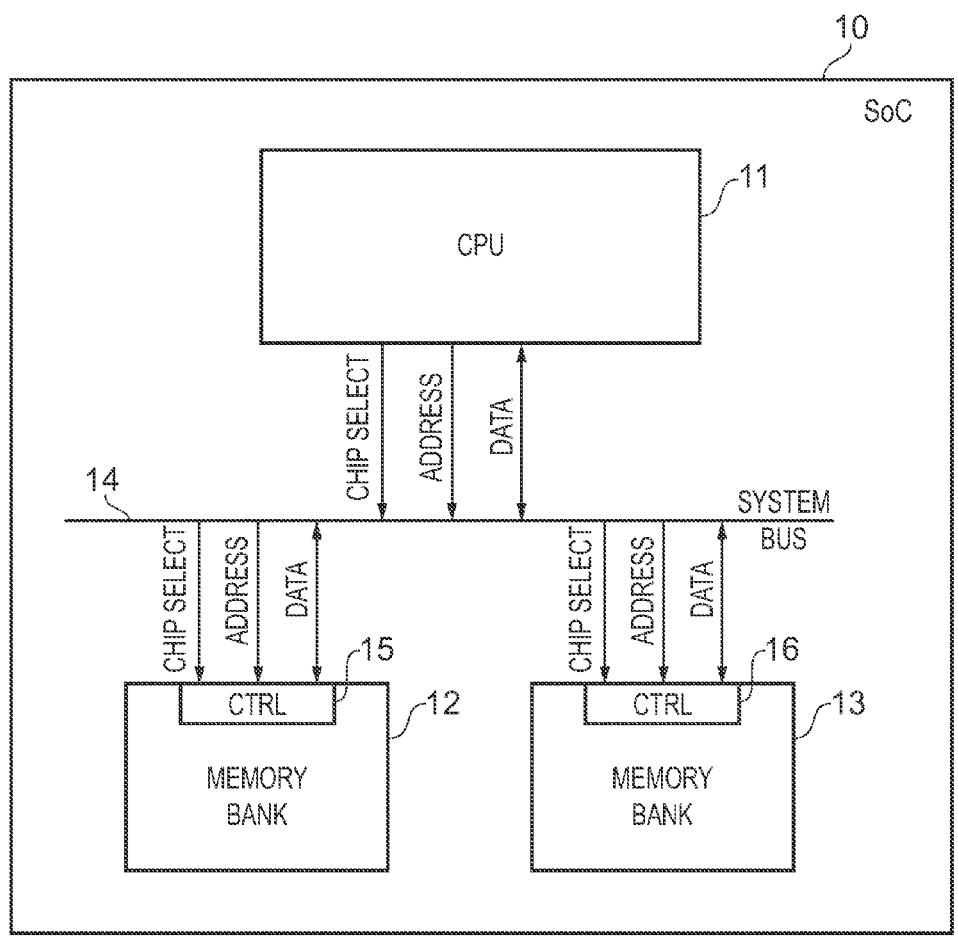
FIG. 1 is schematically illustrates a prior art system-on-chip device comprising a processor and two memory banks.
Figure 2:
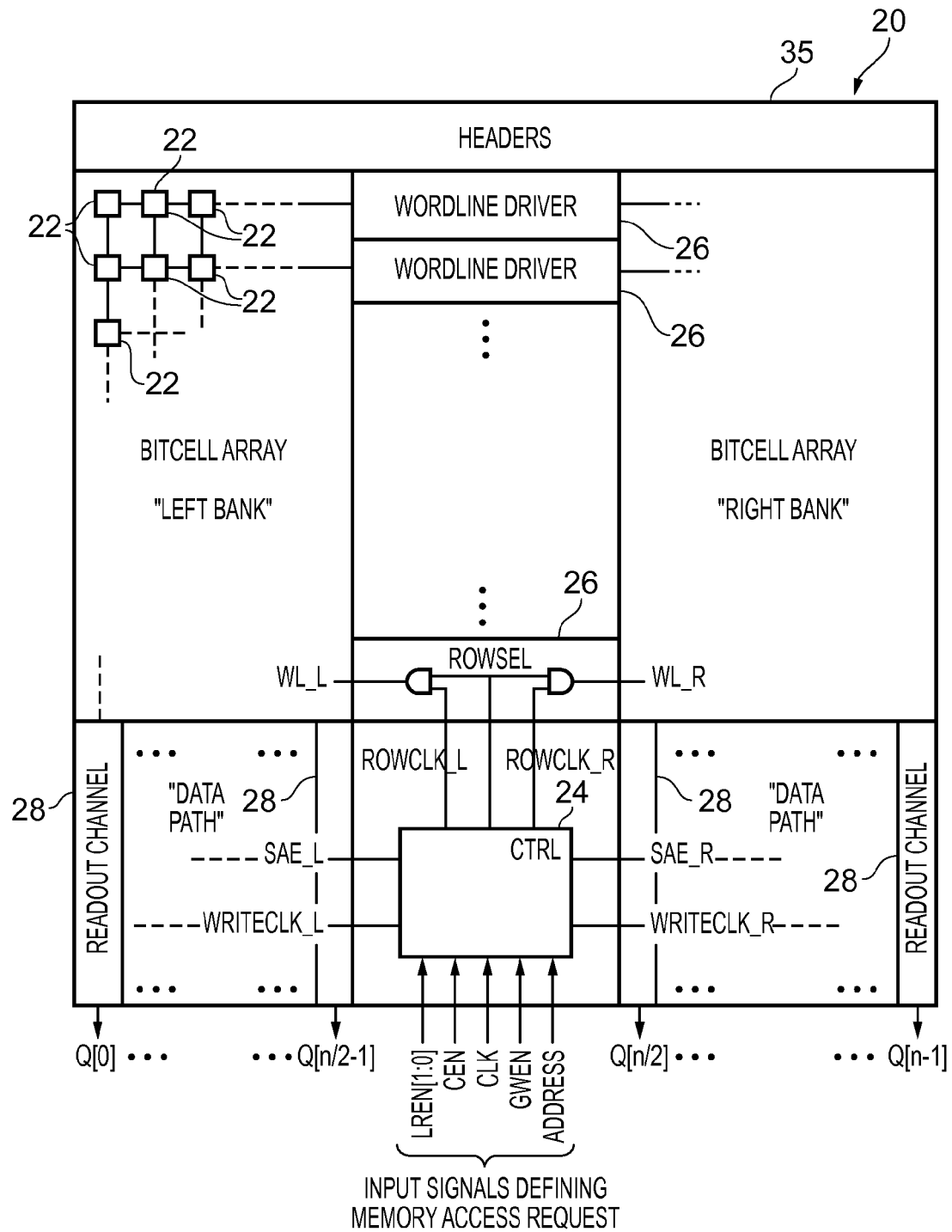
FIG. 2 schematically illustrates a memory device according to one embodiment.

FIG. 2 schematically illustrates a memory device in one embodiment. This memory device 20 may for example replace one of the memory banks 12, 13 shown in the prior art system of FIG. 1. Accordingly, the memory device 20 in this example embodiment can represent a memory bank provided in a system-on-chip (SoC) device, in which the memory device 20 is accessible to a processing unit configured to perform data processing operations (such as the CPU 11 shown in FIG. 1). The memory device 20 generally comprises an array of bit cells 22 each configured to store a data bit and which may be accessed under the control of the control unit 24. As will be familiar to one of ordinary skill in the art, the bit cells 22 are arranged in a matrix of rows and columns, wherein wordline drivers 26 are provided to activate rows of bits cells for reading or writing, whilst in the sections of the memory device generally denoted "data path" in FIG. 2 readout channels 28 are provided which correspond to each column of bit cells. These readout channels 28 each provide the necessary circuitry (sense amplifiers and so on) to read out the data value stored in a particular bit cell 22 when that bit cell is activated by its corresponding wordline driver, coupled to its respective bit line for readout, and so on. The output of each readout channel 28 is provided at the pins labelled Q on the periphery of the memory device. The architecture of the data processing system of which the memory device 20 forms part is based on an n-bit data word, and hence the output pins in FIG. 2 are labelled Q[0] to Q[n−1].

The control unit 24 is configured to receive various input signals, of which only those relevant to the present discussion are illustrated in FIG. 2. On the basis of these input signals, the control unit 24 generates various further control signals which operate within the memory device 20 to control its operation. In particular three such control signals are of significance, and discussed further, here namely the wordline signals WL, the sense amplifier enable signals SAE and the write clock signals WRITECLK. Whereas in the prior art these signals would be provided to the entire bank, according to the present techniques these signals are generated in versions which are specific to each half of the bank. Accordingly, as can be seen in FIG. 2, these signals are provided as {WL_L, SAE_L and WRITECLK_L} and {WL_R, SAE_R and WRITECLK_R}. In the example wordline driver shown closest to the control unit 24 in FIG. 2 it can be seen that the wordline signals WL_L and WL_R are generated as the combination ('AND') of the signals ROWSEL and ROWCLK_L/ROWCLK_R respectively. ROWSEL is the usual row selection signal derived from part of the ADDRESS signal forming part of the memory access request, whilst the present techniques provide that the usual row clock signal ROWCLK is generated in two parts (ROWCLK_L/ROWCLK_R) for the respective halves of the bank. Similarly, the present techniques provide that the usual sense amplifier enable signals SAE and the write clock signals WRITECLK are generated in two parts (SAE_L/SAE_R and WRITECLK_L/WRITECLK_R) for the respective halves of the bank. The generation of these control signals will be discussed in more details below with reference to FIG. 3.

One particular input signal of relevance to the present description is the bank mask signal LREN [1:0]. When neither bit of this two-bit signal is asserted, i.e. when LREN[0] is 0 and LREN[1] is 0, the control unit 24 is configured to control the memory device 20 to carry out a "normal" memory access request in dependence on the remaining input signals received. For example, if the input signals define a read memory access request, the control unit 24 is configured to interpret the memory address specified in that memory access request to determine the row of bit cells which corresponds to that memory address. The corresponding wordline driver 26 is then controlled to activate the wordline corresponding to that row of bit cells. The appropriate wordline driver 26 thus activates a wordline across the full width of the array of bit cells, i.e. a full row of bits cells, which according to the labelling shown in FIG. 2 covers both the "left bank" and the "right bank" note that the array of bits cells 22 of the memory device 20 represents a "bank" within the conventional terminology used to describe memory devices, and the phrases "left" and "right" are used with a particular meaning here, namely corresponding to the least significant bit and most significant bit halves of the data words that make up the full width of the memory array. In coordination with the activation of the appropriate wordline, the read out channels 28 of the memory device 20 are activated under control of the control unit 24 such that the word stored in the bit cells of the selected row can then be read out (via the bit lines which follow each column of bit cells in the usual fashion). Note that for simplicity of illustration only, only four read out channels 28 are explicitly illustrated in the lower portion of the memory device 20 whereas in reality a read out channel is provided for each column of bit cells. The requested data word is then presented at the outputs Q[0] to Q[n−1].

By contrast when at least one bit of the LREN signal is asserted, the control unit 24 is configured to cause a modified memory access to be performed. For example, where the bit LREN[1] is asserted, the control unit 24 modifies the memory access procedure so that only bit cells in the "left bank" are accessed. In particular, when LREN[1] is asserted, only the signals WL_L, SAE_L and WRITECLK_L are generated, whilst the corresponding signals relating to the "right bank" are not generated, namely WL_R, SAE_R and WRITECLK_R. In this situation only the output pins Q[0] to Q[n/2−1] are active (toggle).

Conversely, when LREN[0] is asserted in association with the memory access request then generation of the control signals for the left bank are suppressed. Hence, only the signals WL_R, SAE_R and WRITECLK_R are generated, whilst the corresponding signals relating to the "left bank" are not generated, namely WL_L, SAE_L and WRITECLK_L. In this situation only the output pins Q[n/2] to Q[n−1] are active (toggle).

It is even possible for both bits of LREN to be asserted, for example for testing purposes, causing a dummy memory access to be carried out in which the wordlines, sense amplifier enable signals and write clock signals on both sides of the memory device are suppressed. These permutations are set out in the following table.

| LREN [1:0] | Operation | Q [n−1:n/2] Right-side bits | Q [(n/2)−1:0] Left-side bits | Comments |
|---|---|---|---|---|
| 00 | Read/Write | Toggle | Toggle | Full read/write operation. Word-lines toggle on both the left & right banks. Max read/write dynamic power. |
| 01 | Read/Write | No-change | Toggle | Partial read/write. Word-lines/SAE on the left-bank (LSB) are inactive. Word-lines/SAE on the right-bank (MSB) are active. ~40% less dynamic power compared to full read/write. |
| 10 | Read/Write | Toggle | No-change | Partial read/write. Word-lines/SAE on the left-bank (LSB) are active. Word-lines/SAE on the right-bank (MSB) are inactive. ~40% less dynamic power compared to full read/write. |
| 11 | Read/Write | No-change | No-change | Dummy read/write. Neither left-bank nor right-bank word-lines/SAE are active in this cycle. Negligible dynamic power compared to full read/write. |

Note that one input signal received by the control unit 24 is a chip select signal CEN. A global timing pulse (GTP) employed within the control unit 24 is generated in dependence on this chip select signal and the received clock signal CLK, such that the global timing pulse can only be generated within the memory device when the chip-select-signal CEN is asserted. Additionally the control unit 24 is configured to power down the memory device 20 when the chip-select-signal CEN is not asserted. This for example involves causing the headers 35 to be turned off. Whilst the de-assertion of the chip enable signal is an effective means of reducing power consumption of the memory device 20, several clock cycles are required to enter (and exit) this power saving mode. Furthermore, the entire memory device becomes inaccessible when this power saving mode (chip select off) is engaged.

Figure 3:
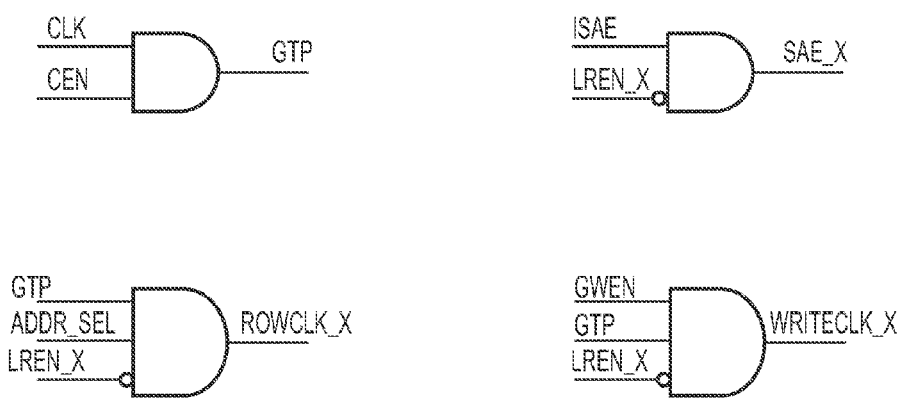
FIG. 3 schematically illustrates the generation of various control signals in a control unit such as that illustrated in FIG. 2.

FIG. 3 schematically illustrates how various control signals are generated within the control unit 24 shown in FIG. 2. As mentioned above, the global timing pulse (GTP) requires both the clock signal (CLK) received by the control unit to be active and the chip select signal CEN. The sense amplifier enable signal for each half of the memory device (labelled SAE_X in FIG. 3) requires the assertion of the general sense amplifier enable signal ISAE (generated within the control unit 20 in the usual fashion) and the non-assertion of corresponding bank mask signal LREN_X (where X is L or R as appropriate and it is understood that LREN[0] is equivalent to LREN_L and LREN[1] is equivalent to LREN_R). The row clock signals ROWCLK_X require the assertion of the global timing pulse GTP, the address selection signal ADDR_SEL (derived from the input signal ADDRESS) and the non-assertion of corresponding bank mask signal LREN_X. Finally the write clock signals WRITECLK_X require the assertion of the global timing pulse GTP, the global write enable signal GWEN (one of the input signals) and the non-assertion of corresponding bank mask signal LREN_X.

Figure 4:
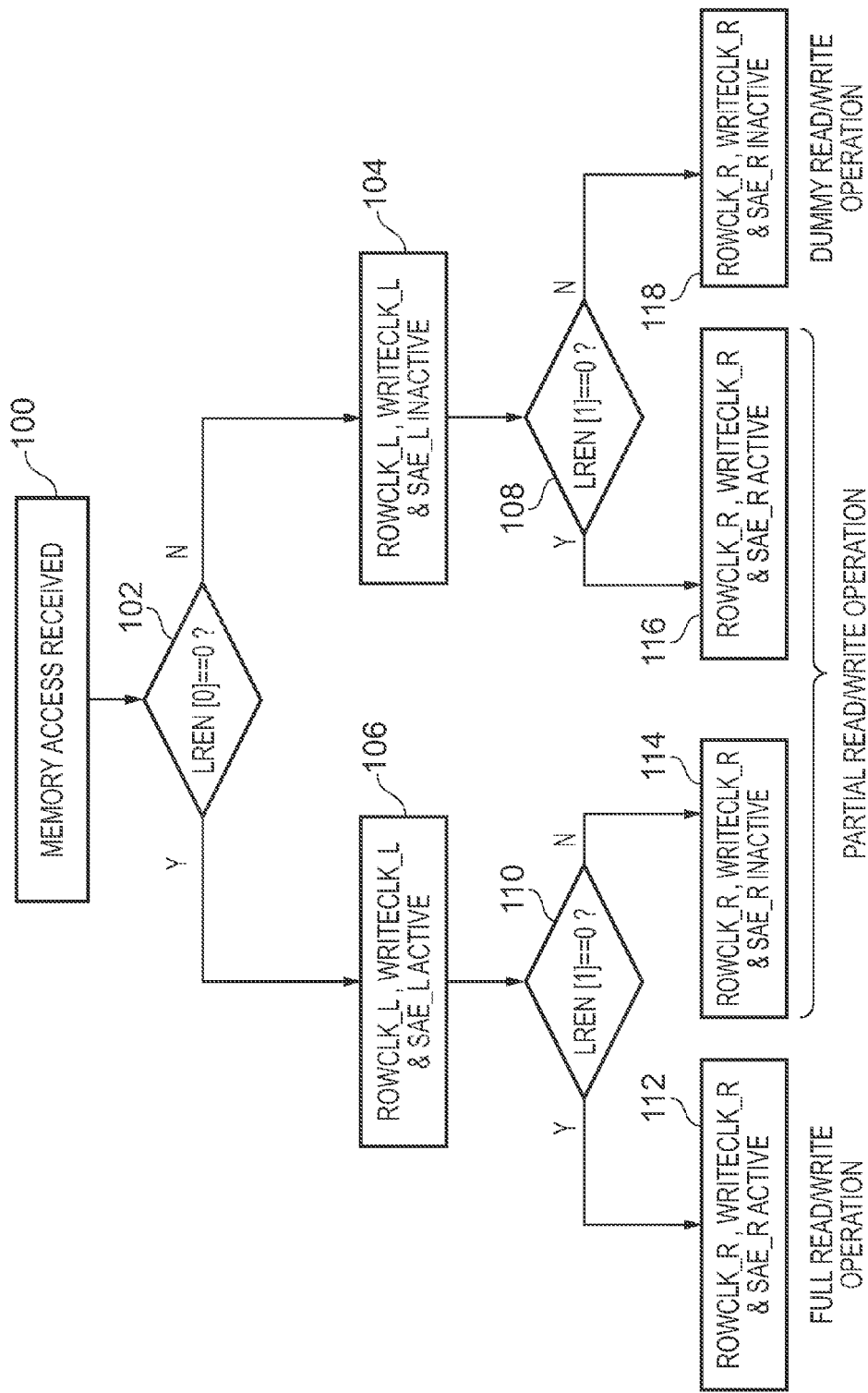
FIG. 4 schematically illustrates a series of steps which are taken in a memory device in one embodiment.

FIG. 4 schematically illustrates a sequence of steps which may be taking in one embodiment, in particular by the control circuitry of a memory device such as that illustrated in FIG. 2. Here "control circuitry" should be understood to mean not only the control unit 24, but also the wordline drivers 26 and components in the read out channels 28 within the data paths. When a memory access is received at step 100 it is thereafter determined at step 102 if the LSB of the LREN signal (i.e. LREN[0]) is set to 0. If it is not, i.e. if this bit is asserted, then the flow proceeds to step 104 and the control signals generated by the control unit 24 with respect to the left bank of the array (i.e. ROWCLK_L, WRITE CLK_L and SAE_L) are inactive. Next at step 108 it is determined if the MSB of the LREN signal (i.e. LREN[1]) is set to 0. If it is not, i.e. if this bit is asserted, then the control signals generated by the control unit 24 with respect to the right bank of the array (i.e. ROWCLK_R, WRITECLK_R and SAE_R) are also inactive. Accordingly, in this configuration both halves of the bit cell array are inactive and a fully dummy read/write operation is carried out. By contrast if at step 108 it is determined that LREN[1] is 0 then (step 116) the above-mentioned control signals with respect to the right bank of the array are active. Accordingly, in this configuration a partial read/write operation is carried out.

Returning to step 102, if it is determined that LREN[0] is set to 0 then (step 106) the control signals associated with the left bank of the array will be active. At step 110 it is determined if LREN[1] is asserted. If it is not then (step 112), the control signals associated with the right bank of the array are also active and a full read/write operation with respect to the bit cell array is carried out. If however at step 110 it is determined that LREN[1] is asserted then (step 114) the control signals associated with the right bank of the array are inactive. Accordingly, a partial read/write operation carried out.

It should be understood that the steps shown in FIG. 4 are not taken in sequential order, but are merely illustrated in this fashion for ease of discussion. In reality the determination of the assertion of the LREN bits (steps 102, 108 and 110) takes place simultaneously, and the final state of the left bank (steps 104, 106) and right bank (steps 112, 114, 116, 118) thus result in parallel with one another.

Figure 5:
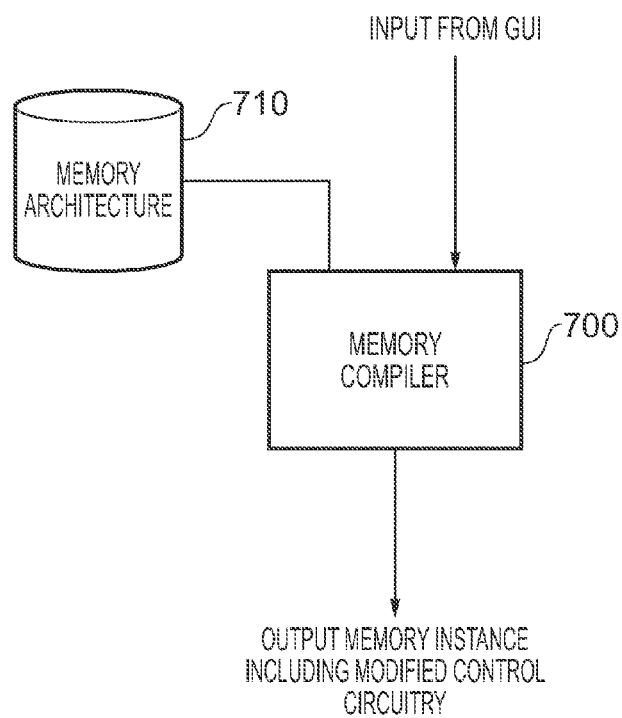
FIG. 5 schematically illustrates the generation of a memory instance including modified control circuitry by a memory compiler in one embodiment.

FIG. 5 schematically illustrates how a memory instance including modified control (decode) circuitry and write driver circuitry in accordance with the above described embodiments may be created from a memory compiler 700 with reference to a memory architecture 710. The memory architecture 710 specifies a definition of circuit elements and data defining rules for combining those circuit elements in order to create a memory instance. Particular requirements for the memory instance are entered into the memory compiler 700 as input parameters via a graphical user interface (GUI). As will be appreciated by those skilled in the art, such input parameters can specify various aspects of the desired memory instance, for example defining the size of the memory array, the multiplexing arrangements of the memory array, selection of various optional features such as power gating features, built-in-self-test (BIST) modes to be supported, etc.

The memory compiler 700 then generates the required memory instance based on the input parameters and the memory architecture 710. In accordance with one embodiment, the memory compiler modifies the control circuitry (i.e. control unit circuitry and write driver circuitry) so that the above discussed "left bank" and "right bank" specific control signals (WL_L/R, ROWCLK_L/R, SAE_L/R and WRITECLK_L/R) within the memory instance are provided to enable the configurations described with reference to FIGS. 2-4 above.

Figure 6:
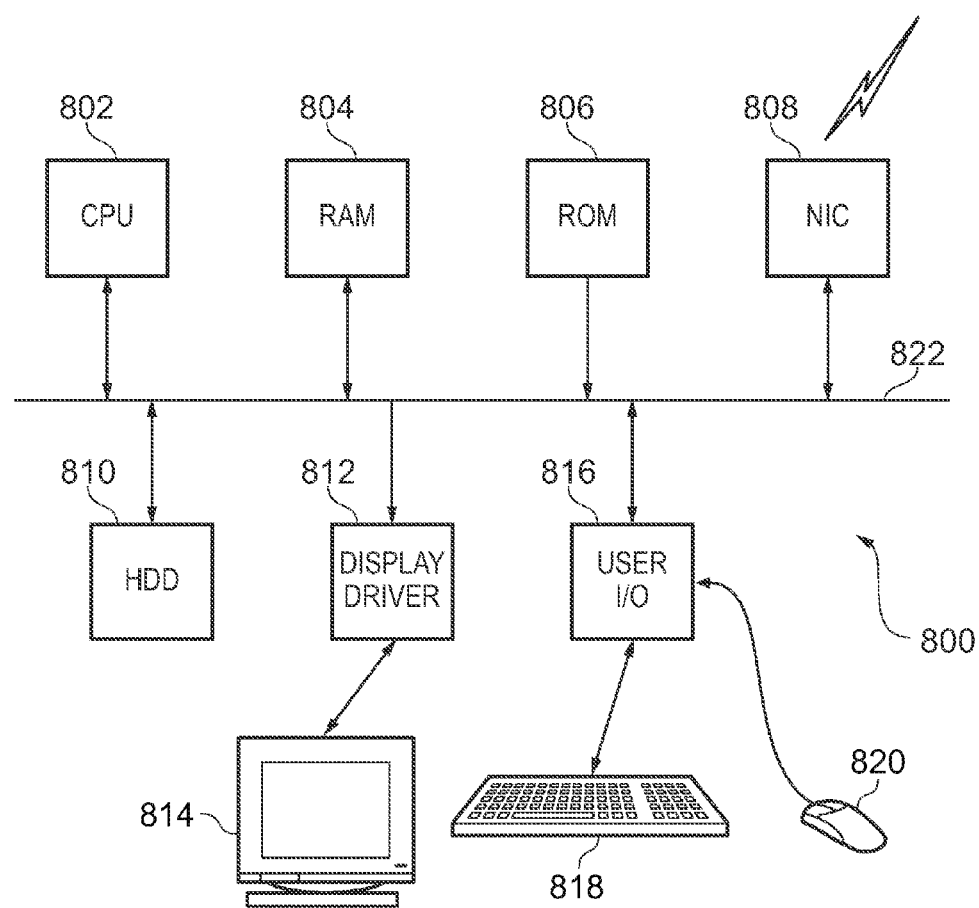
FIG. 6 schematically illustrates a general purpose computing system that may be used to run the memory compiler shown in FIG. 5.

FIG. 6 schematically illustrates a general purpose computer 800 of the type that may be used to implement the above described memory compilation operation in order to generate a memory instance. The general purpose computer 800 includes a central processing unit 802, a random access memory 804, a read only memory 806, a network interface card 808, a hard disk drive 810, a display driver 812 and monitor 814 and a user input/output circuit 816 with a keyboard 818 and mouse 820 all connected via a common bus 822. In operation the central processing unit 802 will execute computer program instructions that may be stored in one or more of the random access memory 804, the read only memory 806 and the hard disk drive 810 or dynamically downloaded via the network interface card 808. The results of the processing performed may be displayed to a user via the display driver 812 and the monitor 814. User inputs for controlling the operation of the general purpose computer 800 may be received via the user input output circuit 816 from the keyboard 818 or the mouse 820 (and hence for example the input parameters used to determine certain properties of the required memory instance can be entered via this mechanism). It will be appreciated that the computer program could be written in a variety of different computer languages. The computer program may be stored and distributed on a recording medium or dynamically downloaded to the general purpose computer 800. When operating under control of an appropriate computer program, the general purpose computer 800 can perform the above described memory compiler operation and can be considered to form an apparatus for performing the above described memory compiler operation. The architecture of the general purpose computer 800 could vary considerably and FIG. 6 is only one example.

Although particular embodiments of the invention have been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A memory device comprising:
an array of bitcells, each bitcell configured to store a data bit, wherein said array comprises a plurality of rows of bitcells and a plurality of columns of bitcells;
a plurality of wordlines, wherein each row of bitcells has an associated wordline;
a plurality of readout channels, wherein each column of bitcells has an associated readout channel; and
control circuitry configured to control access to said array of bitcells, wherein in response to a memory access request which specifies a memory address said control circuitry is configured to activate a selected wordline and to activate said plurality of readout channels, and to access a row of bitcells in said array storing a data word and addressed by said memory address, wherein said data word includes a number of data bits given by a number of bitcells in each row of bitcells,
wherein said control circuitry is further configured to be responsive to a masking signal and, when said masking signal is asserted when said memory access request is received, said control circuitry is configured to activate only a portion of said selected wordline and a portion of said plurality of readout channels, such that only a portion of said data word is accessed.

2. The memory device as claimed in claim 1, wherein each wordline of said plurality of wordlines comprises two partial wordlines, each partial wordline associated with part of each row of bitcells, and wherein said portion of said selected wordline is a selected partial wordline.

3. The memory device as claimed in claim 2, wherein activation of each partial wordline is dependent on a wordline clock signal and wherein said control circuitry is configured to generate first and second wordline clock signals, wherein at least one of said first and second wordline clock signals is inactive when said masking signal is asserted.

4. The memory device as claimed in claim 1, wherein said portion of said selected wordline and said portion of said plurality of readout channels correspond to a selected half of said data word.

5. The memory device as claimed in claim 4, wherein said selected half of said data word comprises a most-significant-bit half of said data word.

6. The memory device as claimed in claim 4, wherein said selected half of said data word comprises a least-significant-bit half of said data word.

7. The memory device as claimed in claim 1, wherein said masking signal is a 2-bit signal, wherein a first bit of said 2-bit signal corresponds to said selected portion of said data word and a second bit of said 2-bit signal corresponds to a remaining portion of said data word.

8. The memory device as claimed in claim 7, wherein said masking signal is a 2-bit signal, wherein a first bit of said 2-bit signal corresponds to said selected half of said data word and a second bit of said 2-bit signal corresponds to a remaining half of said data word.

9. The memory device as claimed in claim 1, wherein said memory device is a system-on-chip device.

10. The memory device as claimed in claim 1, wherein said memory device is further configured to receive a device enable signal, wherein said memory device is configured to transition into an active state in response to assertion of said device enable signal and said memory device is configured to transition into an inactive state in response to de-assertion of said device enable signal.

11. A computer program storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device as claimed in claim 1.

12. A memory device comprising:
an array of means for storing data bits, wherein said array comprises a plurality of rows of means for storing data bits and a plurality of columns of means for storing data bits;
a plurality of wordlines, wherein each row of means for storing data bits has an associated wordline;
a plurality of readout channels, wherein each column of means for storing data bits has an associated readout channel; and
means for controlling access to said array of means for storing data bits, wherein in response to a memory access request which specifies a memory address said means for controlling access is configured to activate a selected wordline and to activate said plurality of readout channels, and to access a row of means for storing data bits in said array storing a data word and addressed by said memory address, wherein said data word includes a number of data bits given by a number of means for storing data bits in each row of means for storing data bits,
wherein said means for controlling access is further configured to be responsive to a masking signal and, when said masking signal is asserted when said memory access request is received, said means for controlling access is configured to activate only a portion of said selected wordline and a portion of said plurality of readout channels, such that only a portion of said data word is accessed.

13. A method of storing data in a memory device, wherein said memory device comprises:
- an array of bitcells, each bitcell configured to store a data bit, wherein said array comprises a plurality of rows of bitcells and a plurality of columns of bitcells;
- a plurality of wordlines, wherein each row of bitcells has an associated wordline; and
- a plurality of readout channels, wherein each column of bitcells has an associated readout channel, the method comprising the steps of:
- receiving a memory access request which specifies a memory address;
- activating a selected wordline of said plurality of wordlines corresponding to said memory address;
- activating said plurality of readout channels; and
- accessing a row of bitcells in said array storing a data word and addressed by said memory address, wherein said data word includes a number of data bits given by a number of bitcells in each row of bitcells,
- wherein when a masking signal is received when said memory access request is received, only a portion of said selected wordline and a portion of said plurality of readout channels are activated, such that only a portion of said data word is accessed.

* * * * *